(12) United States Patent
Tanghe

(10) Patent No.: US 10,651,894 B2
(45) Date of Patent: May 12, 2020

(54) TRANSCEIVER UTILIZING ISOLATED SIGNALING AND CONCEALED ISOLATED POWER TO ATTAIN HIGH COMMON MODE WORKING VOLTAGE AND TOLERANCE

(71) Applicant: Linear Technology Holding LLC, Norwood, MA (US)

(72) Inventor: Steven John Tanghe, Essex Junction, VT (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 16/249,692

(22) Filed: Jan. 16, 2019

(65) Prior Publication Data

US 2019/0238181 A1    Aug. 1, 2019

Related U.S. Application Data

(60) Provisional application No. 62/625,279, filed on Feb. 1, 2018.

(51) Int. Cl.
*H04B 3/50* (2006.01)
*H05K 9/00* (2006.01)

(52) U.S. Cl.
CPC .............. *H04B 3/50* (2013.01); *H05K 9/0067* (2013.01)

(58) Field of Classification Search
CPC ........................................................ H04B 1/40
See application file for complete search history.

(56) References Cited

U.S. PATENT DOCUMENTS

| | | | | |
|---|---|---|---|---|
| 2009/0218968 A1* | 9/2009 | Jeung | ...................... | H02P 6/085 318/400.04 |
| 2011/0249515 A1* | 10/2011 | Liu | ........................ | G11C 5/04 365/189.09 |
| 2014/0025138 A1* | 1/2014 | Meskens | .............. | H04R 25/606 607/57 |

FOREIGN PATENT DOCUMENTS

| | | |
|---|---|---|
| CN | 110109855 A | 8/2019 |
| JP | 2019135830 A | 8/2019 |

* cited by examiner

*Primary Examiner* — Shuwang Liu
*Assistant Examiner* — Gina M McKie
(74) *Attorney, Agent, or Firm* — Schwegman Lundberg & Woessner, P.A.

(57) ABSTRACT

A transceiver capable of common mode operating range and output voltage tolerance set by an isolation boundary and not limited by the device type used in the circuitry. The subject technology is a powered isolated transceiver, where the isolated generated supply and ground nodes are concealed and thus do not participate in tests that stress electrostatic discharge (ESD)/electrical overstress (EOS) or voltage tolerance. The architecture of the subject technology has the advantage of extremely high common mode performance and robust performance using low voltage devices and simplified architecture, which in turn provides less capacitive loading, faster operation, less expensive die development, electromagnetic interference (EMI) advantages, and simple active termination. The subject technology includes an isolation architecture that can be used in environments where isolation is used but is also advantageous in systems without the need for isolation.

20 Claims, 3 Drawing Sheets

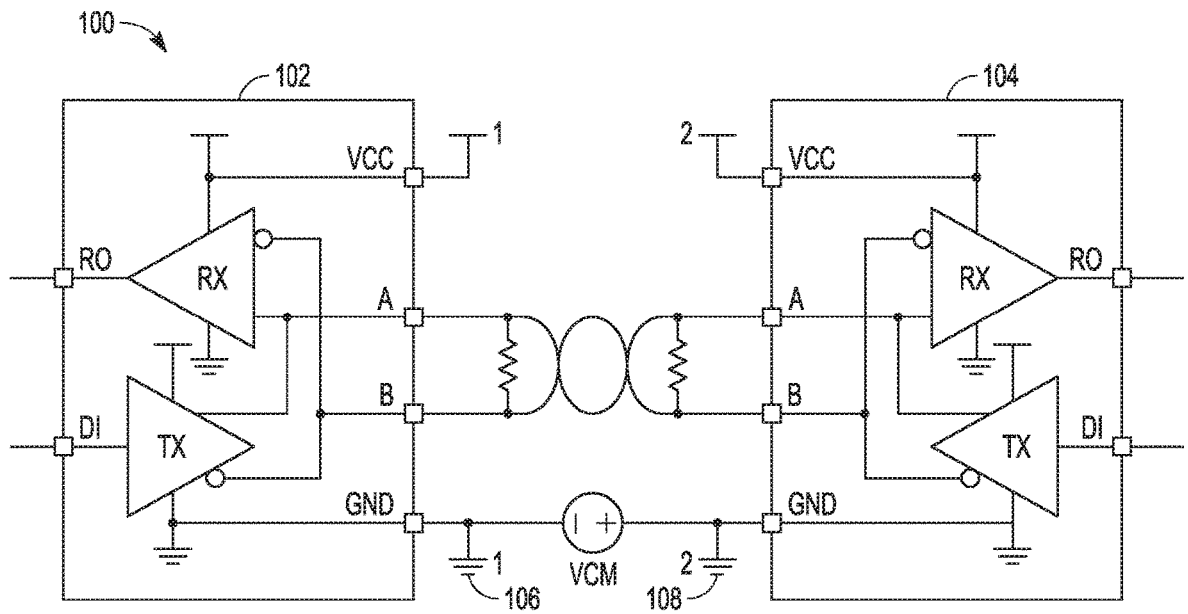
FIG. 1
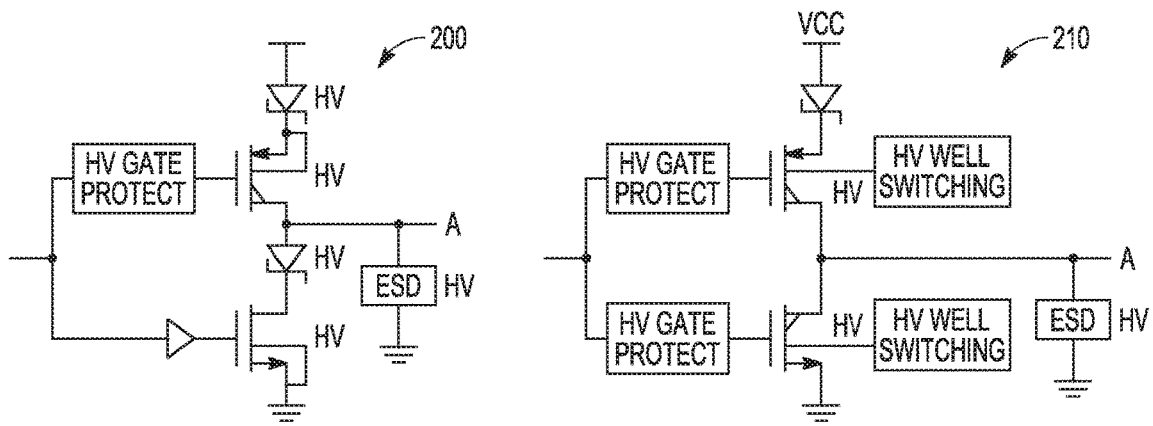
FIG. 2A
FIG. 2B
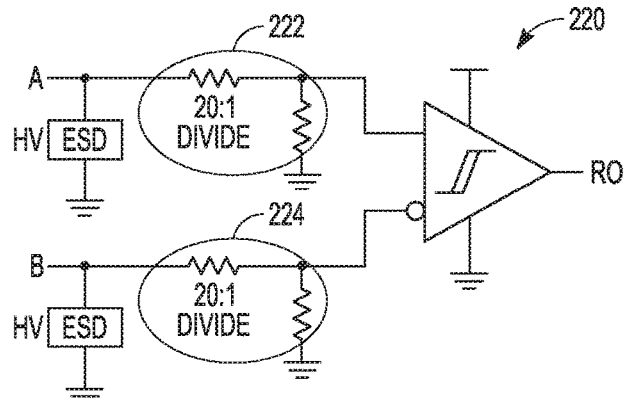
FIG. 2C

TRANSCEIVER UTILIZING ISOLATED SIGNALING AND CONCEALED ISOLATED POWER TO ATTAIN HIGH COMMON MODE WORKING VOLTAGE AND TOLERANCE

FIELD OF THE DISCLOSURE

The present description relates generally to electrical circuits, and more particularly, to a transceiver utilizing isolated signaling and concealed isolated power to attain high common mode working voltage and tolerance.

BACKGROUND

Line transceivers are operable for high speed data communication on multipoint bus transmission lines. Traditional line transceivers, such as transceivers that include an RS485-type interface, are designed to handle a specified input signal range, however, have a limited ability to work and tolerate voltages on their bus lines relative to supply and ground connections. For example, ground potentials vary widely from node to node, often exceeding the specified input signal range. This can result in an interruption of communications, high current flow through ground loops or worse, destruction of a transceiver.

SUMMARY OF THE DISCLOSURE

A transceiver capable of common mode operating range and output voltage tolerance set by an isolation boundary and not limited by the device type used in the circuitry. The subject technology is a powered isolated transceiver where the isolated generated supply and ground nodes are concealed and thus do not participate in tests that stress ESD/ electrical overstress (EOS) or voltage tolerance. The architecture of the subject technology has the advantage of extremely high common mode performance and robust performance using low voltage devices and simplified architecture which in turn provides less capacitive loading, faster operation, less expensive die development, electromagnetic interference (EMJ) advantages, and simple active termination. The subject technology includes an isolation architecture that can be used in environments where isolation is used but is also advantageous in systems without the need for isolation.

According to an embodiment of the present disclosure, a transceiver stem includes a transceiver circuit and an isolation interface circuit coupled to the transceiver circuit that is configured to provide isolation between a transceiver interface and a logic interface. The transceiver system also includes an isolated power supply configured to power a transceiver side of the isolation interface circuit with concealed isolated supply voltage and ground nodes, in some aspects, the transceiver interface has a common mode voltage relative to one of the isolated supply voltage and ground nodes that are relative to voltages at the logic interface.

BRIEF DESCRIPTION OF THE DRAWINGS

Certain features of the subject technology are set forth in the appended claims. However, for purposes of explanation, several embodiments of the subject technology are set forth in the following figures.

FIG. 1 illustrates a schematic of a network environment having non-isolated transceivers connected to one another over transmission lines with a common mode voltage applied between ground nodes of the transceivers.

FIG. 2A illustrates a schematic diagram of an example of a traditional transmitter output architecture that tolerates an output voltage greater than a supply voltage and less than a ground voltage.

FIG. 2B illustrates a schematic diagram of another example of a traditional transmitter output architecture that tolerates an input, voltage greater than a supply voltage and less than a ground voltage.

FIG. 2C illustrates a schematic diagram of an example of a traditional receiver architecture.

DETAILED DESCRIPTION

Figure 3:
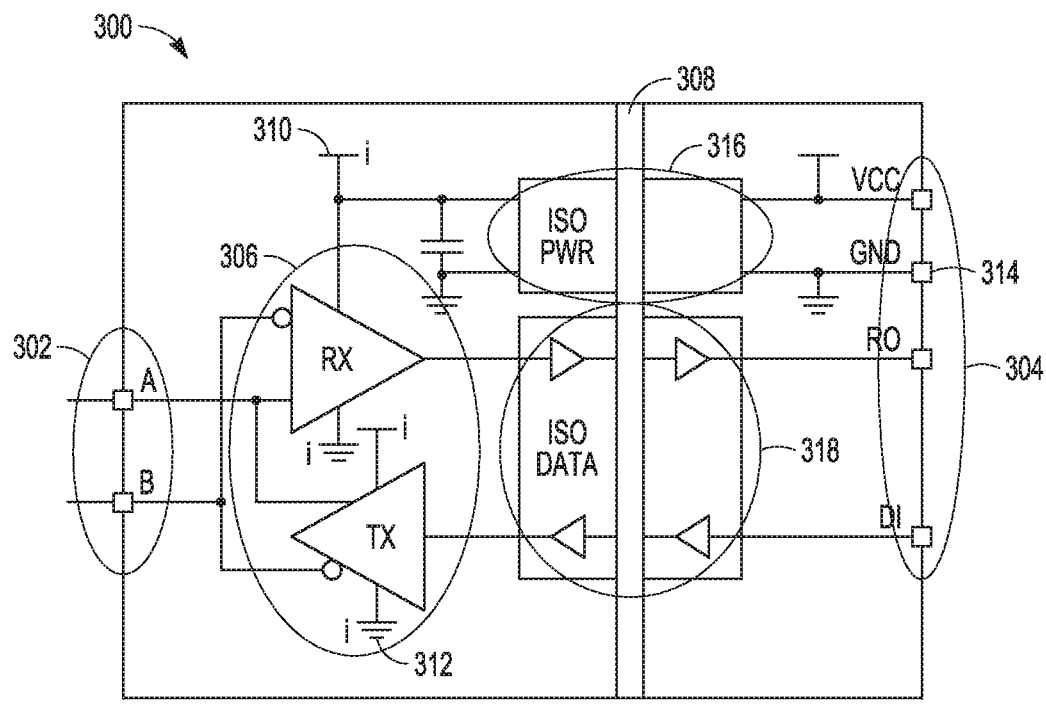
FIG. 3 illustrates a schematic diagram of an example of an isolated transceiver architecture in accordance with one or more implementations of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block diagram form in order to avoid obscuring the concepts of the subject technology.

The subject disclosure provides for a transceiver capable of common mode operating range and output voltage tolerance set by an isolation boundary, using simple low voltage devices to drive and receive signal on the bus. The subject disclosure is directed to a powered isolated transceiver, where the isolated generated supply and ground nodes are concealed and thus do not participate in tests that stress ESD/EOS or voltage tolerance.

Various architectures of isolated transceivers have isolated voltage supply (e.g., VCC) and ground (e.g., GND) pins. In some approaches, the isolated supply and ground pins are needed for powering the isolated side and including a decoupling capacitor. In other approaches the isolated supply and ground pins are brought out for adding a decoupling capacitor. In still other approaches, the isolated supply pins are added so that they can be used to power additional devices or add more decoupling capacitance. However, the subject technology provides for a robust isolated transceiver with high common mode working voltage where the isolated supply and ground are concealed.

The subject disclosure provides an advantage with the use of low voltage devices. For example, the driver output devices and ESD cells are low voltage. This makes them smaller and much easier to design robustly. The driver output devices can be less capacitive as well. A standard process can be used including complementary metal-oxide semiconductors (CMOS). The subject disclosure provides an advantage with providing additional design speed. For example, the use of low-voltage devices and no resistor dividers allow for faster operation. It may be challenging to make a standards-compliant transceiver (e.g., a 150 Mbps RS485 transceiver) using 80V high-voltage (HY) devices, but this can be achieved using the subject technology. The subject disclosure provides an advantage with a simplified design. For example the driver does not require well-switching, isolation diodes, nor resistor dividers. Both the driver and receiver allow faster performance and the receiver has more signal to noise margin. The subject disclosure also provides an advantage with a reduction in size and cost. For example, the subject technology provides a simplified architecture with low-voltage (LV) devices that reduce the and allow for a less costly fabrication process. If the device already uses isolation, the architecture of the subject technology can be less costly than a standard isolated product.

The subject disclosure also provides an advantage with electromagnetic interference protection. For example standard transceivers (e.g. RS485 or CAN) with a common mode difference between nodes have the disadvantage that the bus common mode is controlled by which device is driving it (the transmitter). Therefore, half-duplex communication results in large common mode changes in the bus for each direction change, which can produce high radiated EMI. This is not the case far the subject technology, since the bus common mode voltage is dictated by impedances on the bus external to the subject transceiver. Common mode differences between nodes are absorbed by the isolation barrier, rather than imparted on the transmission cable when transmission direction is changed. This results in minimal EMI radiation since the common mode voltage of the transmission cable does not significantly fluctuate.

FIG. 1 illustrates a schematic of a network environment 100 having non-isolated transceivers (e.g., 102, 104) connected together with a differential transmission line. A voltage, VCM, is applied between two ground nodes (e.g., 106, 108) of the transceivers (e.g., 102, 104, respectively) and represents a common mode voltage shift between the signal lines of the two transceivers at the A and B pins. Some specialized high voltage-tolerant transceivers such as RS485 transceivers and control area network CAN transceivers can tolerate voltages on their bus pins with respect to ground, up to 60V, and with very high ESD levels exceeding 25 kV, among other claims of robustness. In some aspects, multiple devices connected to one another via the bus pins may not only tolerate, but operate, with ground potential differences of up to some common mode voltage specification. For example, RS485-tape transceivers typically can operate under only a limited amount of common mode voltage. According to an RS485 specification (e.g., TIA/EJA-485-A), this common mode voltage (VCM) is in a range of −7 to +12V. For some robust HY-tolerant RS485-type designs this range may be expanded out to 35V. As will be discussed in referent to FIG. 3, the isolation of the subject technology may push the VCM to hundreds or thousands of volts.

FIGS. 2A-2C depict transmitter and receiver architectures that are typically used to handle a voltage range extending beyond the supply and around voltages, typically found in RS485-type or CAN transceivers. FIG. 2A illustrates a schematic diagram of an example of a traditional transmitter output architecture 200, FIG. 2B illustrates a schematic diagram of another example of a traditional transmitter output architecture 210. FIG. 2C illustrates a schematic diagram of an example of a traditional receiver architecture 220.

For example, FIGS. 2A and 2B depict two typical transmitter output architectures 200, 210) that are used to allow a bus voltage to extend well below ground or the voltage supply. The transmitter devices 200, 210) are capable of high voltage (HV) operation matching the output voltage tolerance of the bus (e.g., 60V). FIG. 2C depicts a typical receiver architecture 220 that uses large resistive dividers (e.g., 222, 224) to divide down the common mode voltages before entering a comparator (e.g. 226).

In practice, these architectural choices limit the voltage tolerance of the device to the highest voltage device types in a given technology, which may be around 60V, for example. As this voltage increases, the size of the devices increases, thus limiting performance.

FIG. 3 illustrates a schematic diagram of an example of an isolated transceiver architecture 300 in accordance with one or more implementations of the subject technology. Not all of the depicted components ma be used, however, and one or more implementations may include additional components not shown in the figure. Variations in the arrangement and type of the components may be made without departing from the spirit or scope of the claims as set forth herein. Additional components, different components, or fewer components may be provided.

The isolated transceiver architecture 300 includes a transceiver circuit 306 configured to drive and receive a signal on a transceiver interface 302. The isolated transceiver architecture 300 also includes an isolation interface circuit 318 coupled to the transceiver circuit 306 and configured to isolate the transceiver circuit 306 from a logic interface 304. The isolation interface circuit 318 includes isolation provided by an isolation barrier 308, which allows a high isolation voltage difference between the transceiver circuit 306 and the logic interface 304. The voltage difference across the isolation barrier 308 substantially includes the common mode voltage at the transceiver interface with respect to any exposed ground node of the transceiver system. The isolated ground may be different from a ground node (e.g., 314) associated with the logic interface 304. The isolation interface circuit 308 may be galvanic in some implementations or may be non-galvanic in other implementations.

The isolated transceiver 306 (e.g., RS485 transceiver) is provided with isolated power (e.g., 310) to the isolated side. For example, the power for the transceiver circuit can be generated by an isolated power supply circuit 316. Some examples of the isolated power supply circuit include an isolated power source charge pump or a power converter with a transformer for isolation. The isolated power supply pins (e.g., 310, 312) are concealed (e.g., not pinned out to the transceiver interface 302). For example, the isolated supply voltage 310 and the isolated ground 312 are not pinned out to the transceiver interface 302. This results in a standard pinout for a non-isolated transceiver (like shown in FIG. 1). Hence the common mode voltage at the transceiver interface 302 is defined relative to the exposed ground pin 314 on the logic interface 304. In this way, the high isolation voltage capability of the isolation barrier 308 allows a high common mode voltage substantially equal to the isolation voltage rating. The devices used at the transceiver interface 302 can be standard low voltage devices, because ESD, and electrical over-stress (EOS) from A or B to any other pin, is absorbed by the isolation barrier 308 and not by devices connected between the transceiver interface 302 and the isolated supply 306 or isolated ground 312 connections. In some aspects, the isolation barrier 308 includes, among other things, capacitive isolation, inductive isolation, optical isolation.

Figure 5A:
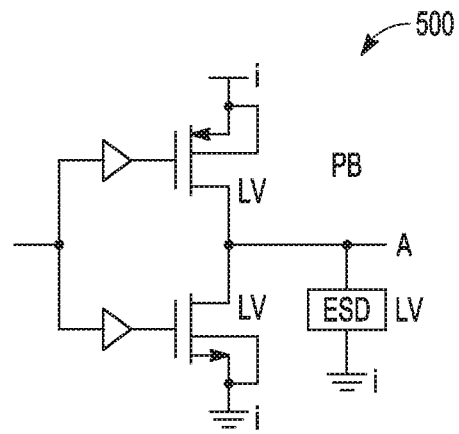
FIG. 5A illustrates a schematic diagram of an example of a transmitter architecture for an isolated transceiver architecture in accordance with one or more implementations of the subject technology.

The architecture of the subject disclosure is also extendable to unidirectional signaling on a bus, and multiple buses. For example, the isolated transceiver 306 may be operable as a receiver or a transmitter with unidirectional signaling on the bus through the transceiver interface 302. The architecture presented thus far does not allow for large voltages from one bus line to another bus line in a differential transceiver if low voltage driver architectures are used as shown in FIG. 5A. This is often not a requirement since most EOS tests, such as electrical fast transients (EFT) are applied as a common mode signal. However, if high line-to-line voltage tolerance is employed, an internal high-voltage device architecture (such as in FIGS. 2A and 2B) can be used in conjunction with the isolated architecture (e.g., FIG. 3) where the isolated supply (e.g., 310) and ground (e.g., 312) are concealed. This offers a significant advantage over existing topologies. For example, traditional RS485-type transceiver may tolerate a voltage maximum of about +/−60V on the bus pins relative to ground (e.g., 106, 108). The transceiver in FIG. 3 (e.g., 300), for example may have the same pinout as a non-isolated transceiver (e.g., 102), and yet the pins of the transceiver interface 302 can be rated for a voltage maximum equivalent to the working voltage of the isolation interface circuit 308 (e.g., greater than +/−600V). The device can tolerate, and even operate, in the presence of this high voltage between the transceiver interface 302 and the logic interface 304.

Figure 4:
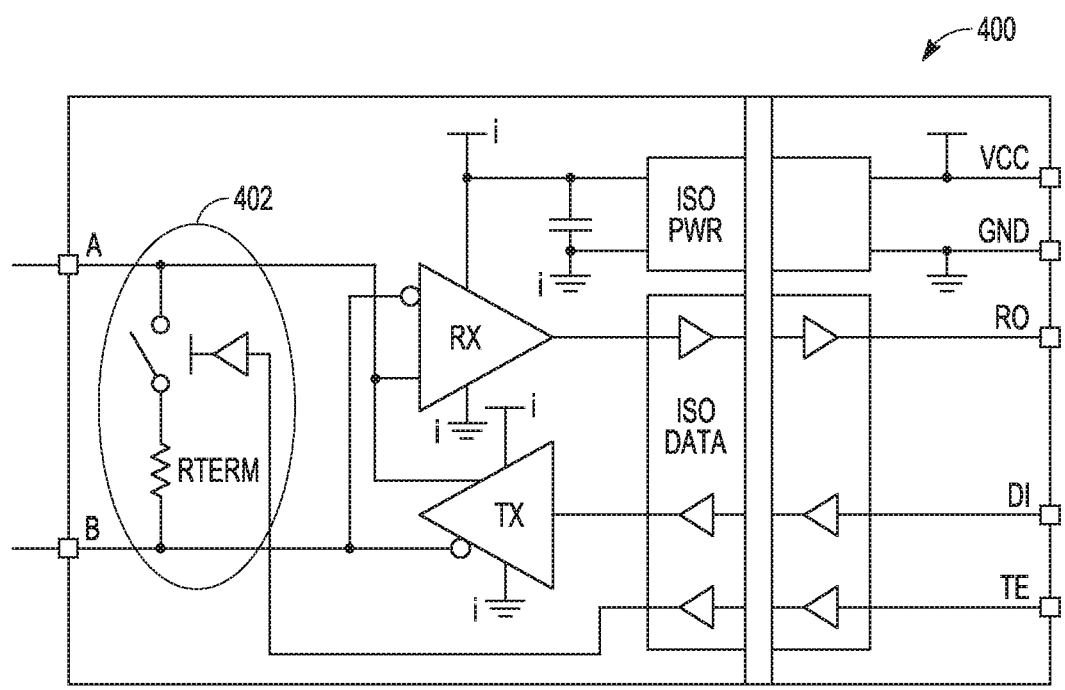
FIG. 4 illustrates a schematic diagram of an example of an isolated transceiver architecture with a selectable termination circuit m accordance with one or more implementations of the subject technology.

FIG. 4 illustrates a schematic diagram of an example of the isolated transceiver architecture 400 with a selectable termination circuit in accordance with one or more implementations of the subject technology. Not all of the depicted components may be used, however, and one or more implementations may include additional components not shown in the figure. Variations in the arrangement and type of the components may be made without departing from the scope of the claims as set forth herein. Additional components, different components, or fewer components may be provided.

A selectable termination over an entire common mode range can be added to the isolated architecture of FIG. 3. For example, FIG. 4 depicts the architecture shown in FIG. 3 extended with an active termination switch (e.g. 402), used to selectively terminate the bus lines. This has been challenging in standard transceiver parts where the termination is specified to remain on or off, as set, over the entire common mode voltage range. The architecture used to do this can be complicated and big, typically involving high voltage charge pumps and high voltage (and very resistive and expensive) FET switches. In the architecture of the subject technology, the switch can be low voltage and simple because it only needs to stay on or off relative to the isolated ground (e.g., 312), which moves with the common mode bus voltage.

Figure 5B:
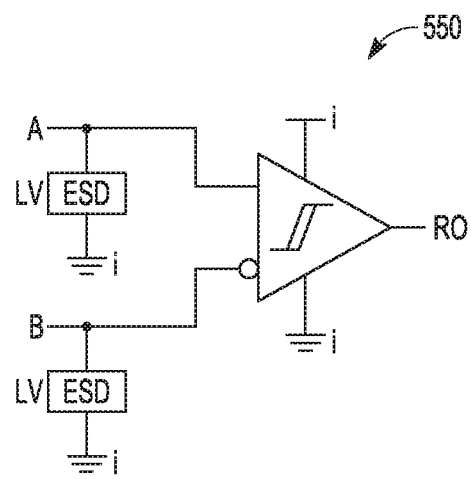
FIG. 5B illustrates a schematic diagram of an example of a receiver architecture for an isolated transceiver architecture in accordance with one or more implementations of the subject technology.

FIG. 5A illustrates a schematic diagram of an example of a transmitter architecture 500 for an isolated transceiver architecture in accordance with one or more implementations of the subject technology. FIG. 5B illustrates a schematic diagram of an example of a receiver architecture for an isolated transceiver architecture 550 in accordance with one or more implementations of the subject technology. Not all of the depicted components may be used, however, and one or more implementations may include additional components not shown in the figure. Variations in the arrangement and type of the components may be made without departing, from the spirit or scope of the claims as set forth herein. Additional components, different components, or fewer components may be provided.

FIGS. 5A and 5B show that the driver and receiver architectures can be simplified compared to those shown in FIGS. 2A-2C. FIG. 5A depicts the transmitter architecture 500 that, uses a low voltage design and can be made very simple. For example, the drive r can use low voltage devices, in a standard CMOS process. FIG. 5B depicts the receiver architecture 550 that can eliminate the input resistor dividers (e.g. 222, 224), or significantly reduce the divider ratio. For example, the receiver can eliminate the resistor divider at the input, offering higher signal to noise ratio and faster performance. In some aspects, the ESD cells are low voltage, as they do not need to stand off a large voltage relative to their local ground.

The previous description is provided to enable any person skilled in the art to practice the various aspects described herein. Various modifications to these aspects will be readily apparent to those skilled in the art and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more" Unless specifically stated otherwise, the term "some" refers to one or more. Pronouns in the masculine (e.g., his) include the feminine and neuter gender (e.g. her and its) and vice versa. Headings and subheadings, if any, are used for convenience only and do not limit the subject disclosure.

The predicate words "configured to", "operable to" and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as air aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" in the ease of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A transceiver system, comprising:
   a transceiver circuit;
   an isolation interface circuit coupled to the transceiver circuit and configured to provide isolation between a transceiver interface and a logic interface of the transceiver system;
   an isolated power supply circuit configured to power a transceiver interface side of the isolation interface circuit using concealed isolated supply voltage nodes and concealed isolated ground nodes; and
   an isolation barrier between the transceiver interface and the logic interface, wherein a common mode voltage at the transceiver interface with respect to any exposed ground node of the transceiver system is taken up across the isolation barrier.

2. The transceiver system of claim 1, wherein a common mode voltage at the transceiver interface with respect to any exposed supply voltage node of the transceiver system is taken up across the isolation barrier.

3. The transceiver system of claim 1, wherein the isolated supply voltage and ground nodes are concealed from the transceiver interface.

4. The transceiver system of claim 1, wherein the transceiver circuit is connected to circuit ground by a concealed isolated ground of the isolated power supply.

5. The transceiver system of claim 1, wherein the transceiver system is included in an integrated circuit and the isolated supply voltage and ground nodes of the transceiver side of the isolation interface circuit exclude electrical connections to an integrated circuit input/output (I/O) contact pad.

6. The transceiver system of claim 1, wherein the transceiver system is included in an electronic package and the isolated supply voltage and ground nodes of the transceiver side of the isolation interface circuit exclude electrical connections to an external contact of the electronic package.

7. The transceiver system of claim 1, further comprising a selectable termination circuit coupled to the transceiver interface and configured to adjust a termination impedance between two terminals of the transceiver interface using a control signal received via the logic interface.

8. The transceiver system of claim 7, wherein the selectable termination circuit adjusts the termination impedance based on a signal voltage relative to one of the isolated supply voltage and ground nodes.

9. The transceiver system of claim 1, wherein the transceiver interface is a bus interface and the transceiver circuit is operable as a receiver or a transmitter interface to the bus with unidirectional signaling.

10. The transceiver system of claim 1, wherein the isolation barrier includes a galvanic isolation barrier.

11. The transceiver system of claim 1, wherein the isolation barrier includes a non-galvanic isolation barrier.

12. The transceiver system of claim 1, wherein the isolation barrier comprises a capacitive isolation barrier.

13. The transceiver system of claim 1, wherein an external connection of the transceiver interface is rated for a voltage difference with respect to the logic interface of greater than or equal to 500 volts.

14. A transceiver system, comprising:
    a transceiver circuit;
    an isolation interface circuit coupled to the transceiver circuit and configured to provide isolation between a transceiver interface and a logic interface of the transceiver system; and
    an isolated power supply circuit configured to power a transceiver interface side of the isolation interface circuit using concealed isolated supply voltage nodes and concealed isolated ground nodes, wherein an isolated ground node associated with the isolated power supply circuit is isolated from a ground node associated with the logic interface.

15. The transceiver system of claim 14, wherein the transceiver system is included in an electronic package and the isolated supply voltage and ground nodes of the transceiver side of the isolation interface circuit exclude electrical connections to an external contact of the electronic package.

16. A differential bus interface comprising:
    a first bus line and a second bus line;
    a first transceiver system operatively coupled to first ends of each of the first and second bus lines, and a second transceiver system operatively coupled to second ends of the first and second bus lines, each of the first and second transceiver systems including:
    a transceiver circuit;
    an isolation interface circuit coupled to the transceiver circuit and configured to provide isolation between a transceiver interface and a logic interface of each transceiver system; and
    an isolated power supply circuit configured to power a transceiver interface side of the isolation interface circuit using concealed isolated supply voltage nodes and concealed isolated ground nodes.

17. The differential bus interface of claim 16, including an isolation barrier between the transceiver interface and the logic interface, wherein a common mode voltage at the transceiver interface with respect to any exposed ground node of the transceiver system is taken up across the isolation barrier.

18. The differential bus interface of claim 17, wherein a common mode voltage at the transceiver interface with respect to any exposed supply voltage node of the transceiver system is taken up across the isolation barrier.

19. The differential bus interface of claim 17, wherein the first bus line and the second bus line are a differential bus line pair, and the isolated supply voltage and ground nodes are concealed from the transceiver interface to the differential bus line pair.

20. The differential bus interface of claim 17, wherein each transceiver system is included in an integrated circuit and the isolated supply voltage and ground nodes of the transceiver side of the isolation interface circuit exclude electrical connections to an integrated circuit input/output (I/O) contact pad.

* * * * *